United States Patent [19]

Legg et al.

[11] Patent Number: 4,967,950
[45] Date of Patent: Nov. 6, 1990

[54] SOLDERING METHOD

[75] Inventors: Stephen P. Legg, Southampton, England; Gustav Schrottke, Austin, Tex.

[73] Assignee: International Business Machines Corporation, Armonk, N.Y.

[21] Appl. No.: 429,880

[22] Filed: Oct. 31, 1989

[51] Int. Cl.⁵ .................... H01L 21/60; H05K 3/34
[52] U.S. Cl. .................... 228/180.2; 228/193; 228/254
[58] Field of Search .................... 228/180.2, 179, 123, 228/193-195, 238, 240, 254, 198

[56] References Cited

U.S. PATENT DOCUMENTS

| 4,033,503 | 7/1977 | Fletcher et al. | 228/124 |
| 4,418,857 | 12/1983 | Ainslie et al. | 228/198 |
| 4,465,223 | 8/1984 | Cammarano et al. | 228/198 |
| 4,518,112 | 5/1985 | Miller et al. | 228/198 |
| 4,876,617 | 10/1989 | Citowsky | 228/180.2 |

FOREIGN PATENT DOCUMENTS

| 240347 | 10/1986 | German Democratic Rep. | 228/179 |
| 258314 | 7/1988 | German Democratic Rep. | 228/180.2 |
| 72756 | 6/1978 | Japan | 228/194 |
| 53-36312 | 10/1978 | Japan . | |
| 62-117346 | 5/1987 | Japan . | |
| 143435 | 6/1987 | Japan | 228/180.2 |

OTHER PUBLICATIONS

Lynch et al., "Brazing by the Diffusion-Controlled Formation of a Liquid Intermediate Phase", Welding Journal, Feb. 1959, pp. 85s-89s.
W. A. Dawson et al, "Indium-Lead-Indium Chip Joining", IBM Technical Disclosure Bulletin, vol. 11, No. 11, 4/69, p. 1528.

Primary Examiner—Sam Heinrich
Attorney, Agent, or Firm—Andrea P. Bryant

[57] ABSTRACT

A method is described for attaching circuit chips to a flexible substrate (laminate) using controlled chip collapse connection technology (C-4). The substrate is "tinned" with an alloy of eutectic composition in its contact region with the solder balls on the base of the chip. The alloy and the solder are chosen such that they are miscible. The system temperature is raised above the alloy melting point thus causing the alloy and the solder to mix, the mixture composition moving away from the eutectic composition with time and thus raising its melting point. Eventually the mixture melting point is higher than the temperature at which the system is maintained and the mixture solidifies to form a contact. In this way contact between the chip and the flexible substrate can be effected at a temperature below the melting point of the pure solder and lower than one which would result in degradation of the laminate adhesive.

11 Claims, 2 Drawing Sheets

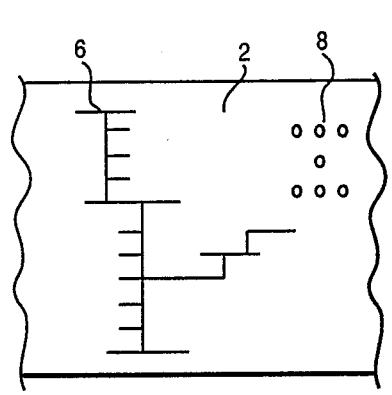
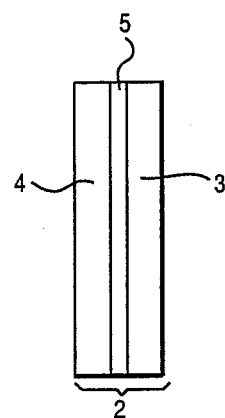
FIG. 1a     FIG. 1b
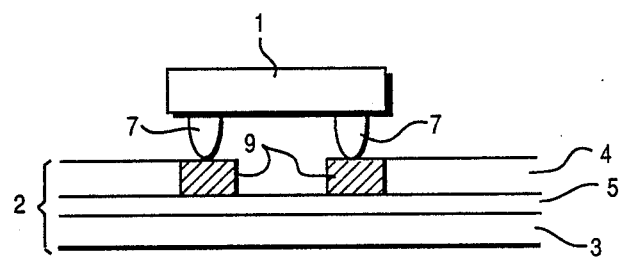
FIG. 2
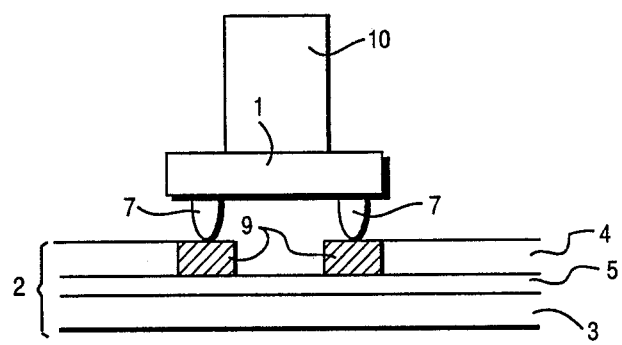
FIG. 3

SOLDERING METHOD

BACKGROUND OF THE INVENTION

The present invention relates to a method of soldering and is of particular relevance to directly attach circuit chips to flexible, circuitized substrates.

DESCRIPTION OF THE PRIOR ART

Controlled collapse chip connections (C-4) soldering technology (otherwise known as controlled collapse bonding, CCB, or flip-chip bonding) has been successfully employed for several years for direct attach of circuit chips to ceramic substrates. As part of this technique, a chip is manufactured with a well defined ball of solder on wettable metal terminals on the underside of the chip. Attachment of this C-4 chip to a substrate is effected via a matching footprint of solder wettable terminals on the substrate. The solder balls on the underside of the chip are placed on the terminals (or pads) and the solder system heated to cause solder reflow, which results in attachment between the chip and the substrate.

The major advantage of this technology is that the well defined shape of the solder balls allows the controlled collapse of the chip onto the substrate, with the chip self-aligning on reflow of the solder to the correct position on the substrate as defined by the pads. The C-4 process is particularly popular as it reduces bonding costs while increasing reliability over other bonding techniques.

Ja 53-36312, Ja 62-117346 and IBM Technical Disclosure Bulletin Vol. 11 No. 11 p1528, describe modified systems wherein the solder balls on the base of the chip are coated with solder having a melting temperature lower than that of the solder balls. The system is heated to a temperature higher than the melting point of the coating solder, but lower than that of the ball solder, such as to effect a contact between the chip and a glass, ceramic or synthetic resin substrate. The collapse of the ball is controlled in that the solder balls on the base of the chip remain intact.

Although a technique widely used for attaching chips to ceramic substrates, C-4 soldering is problematic when used for attaching chips to flexible substrates or laminated circuit boards. Such substrates are constructed of layers of material held in contact by adhesive. The temperature necessary to cause reflow of the C-4 solder is greater than that which would char the adhesive and lead to the effective destruction of the substrate. The composition of the C-4 solder cannot easily be changed to reduce the reflow temperature, as this modifies the surface tension properties of the solder and thus would necessitate major changes in the manufacturing process for forming well defined balls of solder on the chip. Employing a C-4 composition with a lower melting point would also prevent the use of lower melting point solders later on in the manufacturing process (for example in a card to board packaging stage), without remelting of the chip C-4 connections.

A major aim of the present invention has been to devise a method of soldering wherein C-4 technology can be employed for attaching chips to a flexible substrate without necessitating a change in the basic manufacturing techniques used to produce either the chips or the substrate. This is achieved by tinning or coating the pads on the substrate with an eutectic alloy. This alloy melts at a lower temperature than that which would cause degradation of the adhesive and interacts with the C-4 solder balls to decrease the reflow temperature to one which the adhesive in the flexible substrate can tolerate.

U.S. Pat. No. 4,033,503 describes a method for attaching a fused-quartz mirror to a conductive metal substrate which method includes the steps of tinning one surface of the mirror with a solder and the substrate with an eutectic alloy. The system is heated to a temperature above the melting point of the alloy, but below that of the solder, the mirror is positioned and the system then cooled to effect a contact. This prior art differs from the present invention in that the major aim of the patent is to overcome the difficulties in joining two surfaces which have very different rates of thermal expansion; interaction between the solder and the alloy is not important.

It is the essence of the present invention that the mutual solubility of a solder and a molten alloy decreases the temperature at which attachment can be effected. That is, the composition on one side of a joint is changed as a result of material from the other side being dissolved in it.

SUMMARY OF THE INVENTION

According to the present invention a soldering method is provided for attaching items by interaction between a solder and a eutectic alloy, the alloy having a melting point below that of the solder. On heating to a temperature above the melting point of the eutectic alloy, the solder and the alloy are miscible, the effect being to progressively alter the composition of the material at the interface of the solder and eutectic alloy and thus raise the melting point of the molten interface mixture. Heat is applied until such a time as the melting point of that mixture is higher than the temperature at which the system is maintained, with the result that the mixture solidifies. The degree of interaction between the solder and the alloy is governed by their original compositions and the overall temperature at which the system is maintained.

BRIEF DESCRIPTION OF THE DRAWING

Various features and advantages of the present invention will become apparent from the following description of a preferred embodiment with the aid of the accompanying drawings in which like reference numerals are used throughout to denote the same elements and wherein:

FIG. 1a shows a plane view of a flexible circuit substrate;

FIG. 1b shows a side view of a flexible circuit substrate;

FIG. 2 is a side view of the flexible circuit substrate with a C-4 chip thereon;

FIG. 3 shows the same view as in FIG. 2, but with a thermode resting upon the chip.

DESCRIPTION OF THE PREFERRED EMBODIMENT

Figure 4:
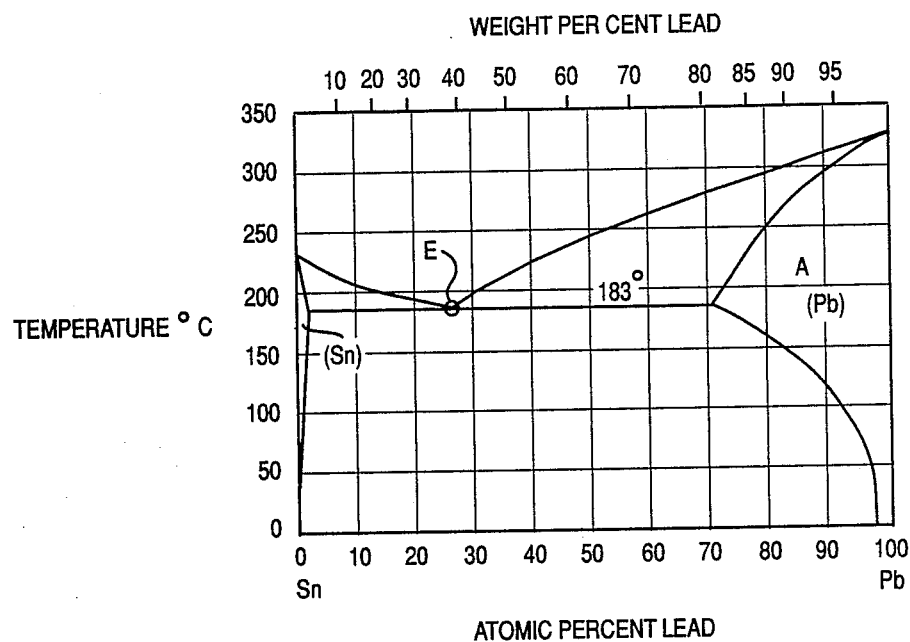
FIG. 4 is a phase diagram for the lead-tin (Pb-Sn) system.

In this specific example of the invention (see FIGS. 1 to 3) a C-4 chip 1 is to be attached to a flexible circuit substrate 2, preferably of Pyralux (Trademark of E. I. duPont de Nemours & Co., Inc.) material. Pyralux is a material typically used in the manufacture of flexible, printed circuit boards and is composed of a base layer of polyimide 3, typically 0.002" thick, connected to a layer of copper foil 4 approximately 0.0015" thick via a thin layer of adhesive 5 (usually 0.001").

The manufacturing process for this material involves laminating the copper foil 4, on which the interconnection pattern 6 for the circuitry required will eventually be etched, to the base material 3 with the adhesive 5 by applying pressure and heating the laminate to a temperature of approximately 180 deg. C. until the adhesive cures. The adhesive 5 softens at around 125 deg. C. and decomposition starts with exposure to temperatures above 220 deg. C.

C-4 solder balls 7 (see FIGS. 2 and 3) typically have compositions of between 3% tin/97% lead to 10% tin/90% lead and require reflow temperatures of at least 320 deg. C., with a peak of 360 deg. C. for a short time. Clearly these temperatures are far above those that would cause degradation of the laminate adhesive.

To overcome this problem, prior to reflow, the Pyralux is tinned, that is, coated, with 63% tin/37% lead alloy (eutectic composition—E in FIG. 4) in the area where the solder balls 7 make contact, that is the chip footprint (8 in FIG. 1). The chip 1 is then placed on the substrate 2, the solder balls 7 being aligned with the alloy pads 9.

A thermode (10 in FIG. 3) can then be used to raise the temperature of the system to the melting point of the alloy, approximately 183 deg. C., a temperature lower than that maximum temperature which the laminate adhesive can tolerate.

The phase diagram in FIG. 4, illustrates that as the melting point E of the eutectic alloy is approached, the pad alloy becomes molten while the ball solder, the composition of which lies within region A remains solid. However, the ball solder is readily soluble in the molten alloy, there being a wide range of miscibility between the two (FIG. 4). As the chip temperature is increased by the thermode to above the eutectic melting point but below that which would degrade the adhesive in substrate 2, some of the chip solder ball material dissolves within the molten alloy, resulting in a progressive change in the composition of the molten mixture at the interface of the chip solder and that on the pad.

Preferential solubility of one metal within the solder over another results in an increase in the melting point of the material on the pad, as initially it was of the eutectic composition, and therefore the melting point rises with time. Essentially the joint is formed as the molten eutectic alloy on the pad 9 becomes pasty due to the dissolution of excess lead from solder ball 7.

The weight of the thermode 10 applies uniform pressure to the chip 1, ensuring intimate contact of the C-4 balls 7 to the pads 9 on the substrate 2. As the composition of the molten mixture deviates from the eutectic composition, a melting point of the chip/ball/pad system is reached where the molten mixture solidifies, completing the joint. Each joint on the chip will undergo this process, the degree of collapse of the original ball and its melting point being limited by the temperature to which the chip is raised, and the relative amounts of tin and lead in both the alloy and the solder which are brought together to make the joint.

The preceding description has illustrated a method of attaching C-4 chips to commercially available, laminated material. Although this example has highlighted the use of the Lead-Tin (Pb-Sn) system, clearly the principles employed could be implemented for controlled collapse connections using alternative miscible solder-alloy compositions. A major advantage of the process described is that standard C-4 technology can be used without the need to modify either the chip or the laminated substrate manufacturing process. A further benefit is that the collapse of the C-4 ball onto the laminate is self-limiting thus preventing the face of the chip ending up in contact with the laminate (an undesirable situation), while it is ensured that all joints are made by the application of pressure to the back of the chip.

While the invention has been described having reference to a particular preferred embodiment, those having skill in the art will appreciate that the above noted modifications and other changes in form and detail may be made without departing from the spirit and scope of the invention as claimed.

We claim:

1. A soldering method for direct attachment of electronic chips to a flexible circuitized substrate comprising the steps of:
   providing a first solid solder on contacts of said chips;
   providing a second solder in which said first solder is miscible on contact pads on said flexible substrate;
   placing said chips at corresponding pads on said flexible circuitized substrate;
   heating where said first and second solders interface for effecting eutectic bonding therebetween.

2. The method of claim 1 wherein providing said first solder includes:
   providing a tin-lead solder, with tin forming between 3% and 10% thereof.

3. The method of claim 1 wherein providing said second solder includes:
   choosing from tin-lead solders, one having a reflow temperature in the range from about 175-190 deg. C.

4. The method of claims 1, 2 or 3 wherein providing said second solder includes:
   providing solder composed of 63% tin and 37% lead.

5. The method of claims 1, 2 or 3 wherein said heating step includes:
   using a thermode for applying heat at said interface of said first and second solders.

6. The method of claim 1 including an additional step of:
   simultaneously with said heating step, applying uniform pressure at every point along said interface of said first and second solders.

7. The method of claim 6 wherein said applying step includes:
   using a mass associated with said thermode for applying uniform pressure.

8. The methods of claim 1 or 6 wherein said heating step comprises:
   providing an atmosphere surrounding said interface at an elevated temperature sufficient to reflow said second solder; and
   said applying step includes providing a weight on said chip.

9. A soldering method for direct attachment of electronic chips to a flexible, circuitized laminated substrate comprising the steps of:
   coating contacts on said chips with a tin-lead solder, with tin comprising about 3-10% thereof;
   covering contact pads on said substrate with 63% tin, 37% lead solder;

placing said chips on said substrate so as to align chip contacts and corresponding contact pads on said substrate; and heating said solder covering said contact pads to a temperature for reflowing said solder, while applying uniform pressure, and effecting a eutectic bond between said chip and said substrate.

10. The method of claim 9 wherein said heating step includes:
   bringing a weighted thermode into contact with said chips.

11. The method of claim 5 including an additional step of:
   simultaneously with said heating step applying uniform pressure at every point along said interface of said first and second solders.

* * * * *